(12) United States Patent
Mei et al.

(10) Patent No.: US 10,141,668 B1
(45) Date of Patent: Nov. 27, 2018

(54) DETACHABLE FLEX-TO-FLEX ELECTRICAL CONNECTION

(71) Applicant: Palo Alto Research Center Incorporated, Palo Alto, CA (US)

(72) Inventors: Ping Mei, San Jose, CA (US); David Eric Schwartz, San Carlos, CA (US); Brent S. Krusor, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 15/642,460

(22) Filed: Jul. 6, 2017

(51) Int. Cl.
| | |
|---|---|
| *H01R 12/78* | (2011.01) |
| *H01R 12/77* | (2011.01) |
| *H05K 1/14* | (2006.01) |
| *H05K 1/02* | (2006.01) |
| *H01R 12/50* | (2011.01) |

(52) U.S. Cl.
CPC ........... *H01R 12/78* (2013.01); *H01R 12/771* (2013.01); *H01R 23/725* (2013.01); *H05K 1/028* (2013.01); *H05K 1/144* (2013.01)

(58) Field of Classification Search
CPC . H01L 2924/01079; H01L 2924/01078; H01L 2224/16; H05K 1/118; H05K 3/222; H05K 3/365; H05K 3/326; H01R 23/725; H01R 12/62; H01R 1/79; H01R 9/096
USPC ....... 439/74, 67, 77, 493; 174/259–261, 268
See application file for complete search history.

(56) References Cited

U.S. PATENT DOCUMENTS

| | | | | |
|---|---|---|---|---|
| 4,113,981 | A * | 9/1978 | Fujita | C09J 201/00 174/257 |
| 5,041,183 | A * | 8/1991 | Nakamura | H01R 4/04 156/264 |
| 5,493,074 | A * | 2/1996 | Murata | H05K 3/28 174/254 |
| 6,017,222 | A * | 1/2000 | Kao | H01R 12/613 439/493 |
| 6,411,518 | B1 * | 6/2002 | Okada | H01L 23/3677 174/259 |
| 6,695,623 | B2 * | 2/2004 | Brodsky | H05K 3/325 29/842 |
| 6,998,539 | B2 * | 2/2006 | Andrews | H01L 24/11 174/257 |
| 7,052,285 | B2 * | 5/2006 | Wu | H05K 3/361 439/67 |

(Continued)

*Primary Examiner* — Gary F Paumen
(74) *Attorney, Agent, or Firm* — Fay Sharpe LLP

(57) ABSTRACT

Printed flexible hybrid electronic systems may require electrical interconnection to peripheral elements. For example, a printed sensor tag with wireless communication may need to connect to a printed sensing electrode on a separated substrate. Frequently, it is desired that these interconnections be detachable in order to replace peripheral elements or to facilitate low cost and simplified assembly, test, rework, and repair. Unlike conventional printed circuit board, mounting a connector on a flexible substrate for detachable connection is challenging due to low temperature requirements. Provide is a teaching of a thin film or form of electrical connection for two circuit elements on separate flexible substrates. The connection is detachable and re-attachable for replacing different circuit elements. The detachable connection is in embodiments realized by selective deposition of fine patterns of conductive materials and non-conductive repositionable pressure-sensitive adhesive.

13 Claims, 4 Drawing Sheets

(56) References Cited

U.S. PATENT DOCUMENTS

| | | | | |
|---|---|---|---|---|
| 7,874,848 B2* | 1/2011 | Nakamura | ............. | H05K 1/142 |
| | | | | 439/67 |
| 8,072,709 B2* | 12/2011 | Rothenberg | ......... | H05K 1/0268 |
| | | | | 174/254 |
| 2002/0151196 A1* | 10/2002 | Tai | ........................... | H05K 3/20 |
| | | | | 439/67 |
| 2002/0182900 A1* | 12/2002 | Brodsky | ................ | H05K 3/325 |
| | | | | 439/66 |
| 2009/0117757 A1* | 5/2009 | Suzuki | .................. | H05K 3/361 |
| | | | | 439/74 |
| 2009/0309220 A1* | 12/2009 | Katogi | ............... | C08G 18/3212 |
| | | | | 257/741 |
| 2010/0193234 A1* | 8/2010 | Kisban | .................... | H01L 24/50 |
| | | | | 174/268 |
| 2014/0057482 A1* | 2/2014 | Su | ........................ | H01R 4/024 |
| | | | | 439/493 |

\* cited by examiner

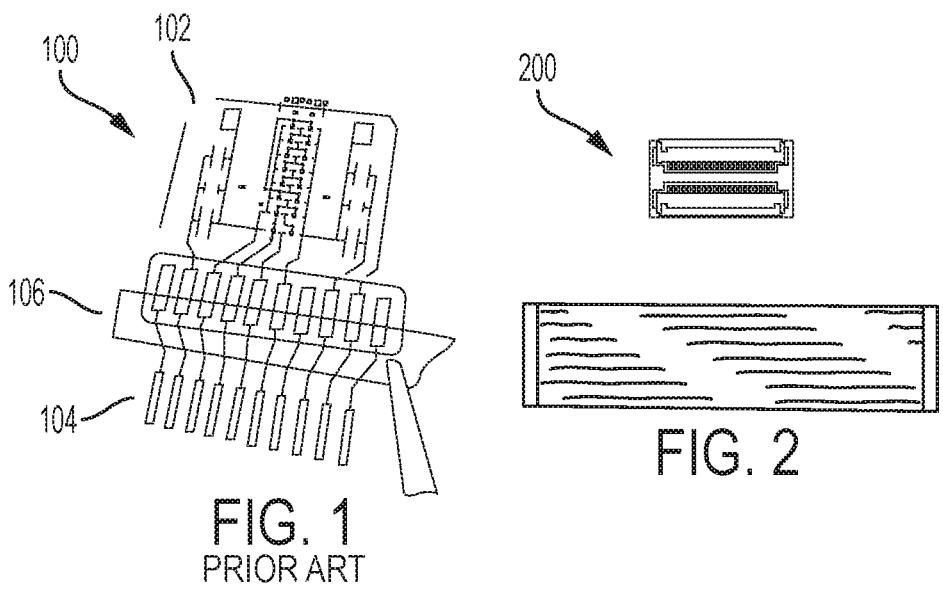
FIG. 1
PRIOR ART
FIG. 2
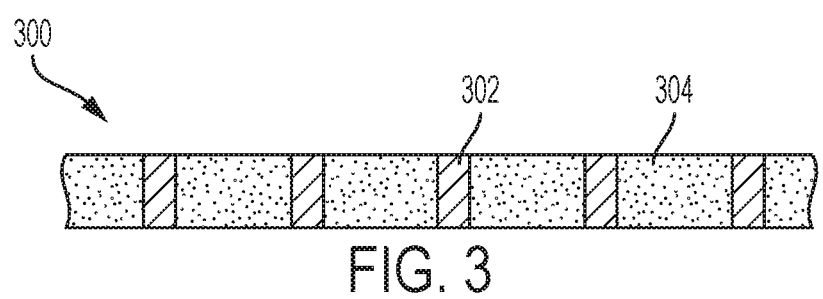
FIG. 3
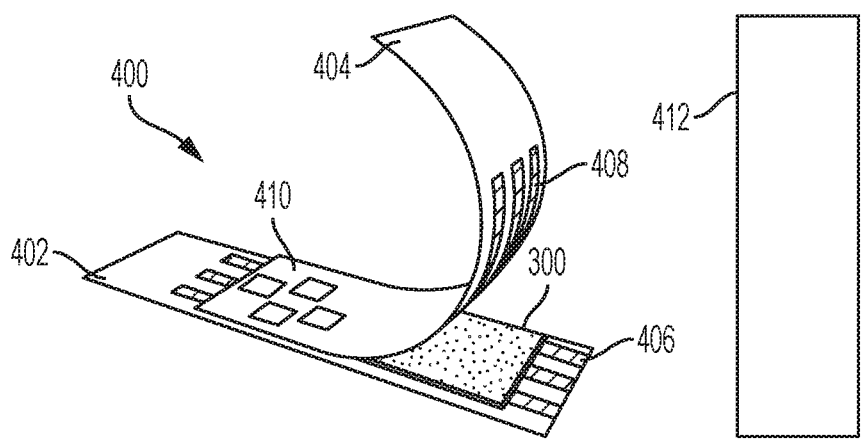
FIG. 4

DETACHABLE FLEX-TO-FLEX ELECTRICAL CONNECTION

STATEMENT REGARDING FEDERALLY SPONSORED RESEARCH OR DEVELOPMENT

This invention was made with United States Government support under U.S. Department of Defense Agreement G014.3802 NextFlex-PC1-Mouthgard beginning on Aug. 1, 2016 awarded by the U.S. Department of Defense. The United States Government has certain rights in this invention.

BACKGROUND

The present application is directed to electronic/electrical circuits or systems, and more particularly to connections for those known as flexible electronic/electrical circuits or systems.

Printed flexible hybrid electronic circuits or systems may require electrical interconnection to peripheral elements. For example, a printed sensor tag with wireless communication may need to connect to a printed sensing electrode on a separated substrate. Frequently, it is desired that these interconnections be detachable in order to replace peripheral elements or to facilitate low cost and simplified assembly, test, rework, and repair.

Unlike conventional printed circuit boards, mounting a connector on a flexible substrate is challenging due to low temperature requirements, such as known in the art.

FIGS. 1 and 2 illustrate solutions for electric flexible (flex) circuit or system interconnection. More particularly, FIG. 1 depicts an arrangement 100 where two flexible circuits or systems 102, 104 are bonded together by an anisotropic conductive adhesive film (ACF) 106. The electric path between pads on the two substrates is established by embedded conductive particles after the application of heat and pressure. However, this type of connection is not considered detachable due to the intended permanent connection that is accomplished by ACF bonding.

Another solution for a flex-to-flex connection is by use of a zero insertion force (ZIF) connector 200, as shown in FIG. 2. With a ZIF socket, before a flex circuit is inserted, a lever on the socket is released, opening a gap so that the flex connection can be inserted with very little force. The lever is then engaged, allowing the contacts to close and grip the contact pads on the flexible circuit. ZIF sockets can be used for detachable connections. However, the ZIF fixture is commonly too rigid and bulky for applications requiring small form factors and desired or required flexibility.

Therefore it is considered useful to provide an electrical connection which permits interconnection between separate substrates, where at least one of the substrates is a flexible substrate. The connection should also be detachable and re-attachable for replacing different substrates carrying circuit elements.

BRIEF DESCRIPTION

Provided is a detachable electrical connection assembly comprising: a conductive material; and an adhesive material consisting of an adhesive composition configured to permit non-permanent attachment, detachment and re-attachment to the adhesive, wherein at least a portion of the conductive material is positioned between the adhesive material having the composition which permits non-permanent attachment, detachment, and re-attachment to the adhesive material.

Further provided is the detachable electrical connection assembly including: a first substrate; a second substrate; and the adhesive material and the conductive material being positioned between the first substrate and the second substrate, wherein at least one of the first substrate and the second substrate are in non-permanent attachment to the adhesive material.

Further provided is the detachable electrical connection assembly including: the first substrate having conductive areas and non-conductive adhesive areas, wherein at least some of the conductive areas of the first substrate are in contact with at least some of the conductive material, and at least some of the non-conductive adhesive areas of the first substrate being in non-permanent attachment to at least some of the non-conductive adhesive material; and the second substrate having conductive areas and non-conductive adhesive areas, wherein at least some of the conductive areas of the second substrate are in contact with at least some of the conductive material, and at least some of the non-conductive areas of the second substrate being in non-permanent attachment to at least some of the adhesive material.

Further provided is the detachable electrical connection assembly wherein at least one of the first substrate and the second substrate include a flexible electronic circuit board.

Further provided is the detachable electrical connection assembly wherein one of the first substrate and second substrate are designed as at least one of a disposable chemical sensor and a disposable biological sensor.

Further provided is the detachable electrical connection assembly wherein the conductive material and the adhesive material are non-anisotropic materials.

Further provided is the detachable electrical connection assembly including: the conductive material and the adhesive material being located on a first surface of a first substrate; conductive ink drops selectively located on portions of the conductive material; and a second substrate having at least some conductive material on the first surface corresponding to at least some of the conductive ink dots, wherein the second substrate is positioned wherein at least some of the conductor material on the second substrate are in contact with at least some of the conductive ink drops.

Further provided is the detachable electrical connection assembly wherein the second substrate further includes adhesive material consisting of an adhesive composition configured to permit non-permanent attachment, de-attachment, and re-attachment to the adhesive material.

Further provided is the detachable electrical connection assembly wherein the adhesive material on the first substrate has a sufficient height to encounter the surface of the second substrate, wherein the second substrate is detachable from the adhesive material of the first substrate.

Further provided is the detachable electrical connection assembly wherein the first substrate is detachable from the adhesive material of the first substrate.

Further provided is the detachable electrical connection assembly wherein a porosity of a structure for the conductive ink drops is smaller than a pitch between portions of the conductive material.

Further provided is the detachable electrical connection assembly wherein at least one of the first substrate and the second substrate are a flexible electronic circuit board.

Further provided is the detachable electrical connection assembly wherein one of the first substrate and second substrate are designed as at least one of a disposable chemical sensor and a disposable biological sensor.

Provided is a method of forming a detachable electrical connection for a flexible circuit comprising: depositing a conductive material onto a first substrate; depositing an adhesive material, consisting of an adhesive composition configured to permit non-permanent attachment, detachment, and re-attachment to the adhesive; and wherein the depositing steps result in at least a portion of the conductive material being positioned between portions of the adhesive material which permits non-permanent attachment, detachment, and re-attachment to the adhesive material.

Further provided is the method comprising: following the depositing of the conductive material onto an area the first substrate, providing a shadow mask over the deposited conductive material prior to the depositing of the adhesive material; depositing of the adhesive material being accomplished by spraying the adhesive material onto the area of the first substrate, wherein the sprayed adhesive material covers the area of the first substrate except for locations defined by the shadow mask which include selected areas of the conductive material; removing the shadow mask to expose portions of the conductive material not covered by the adhesive material; and depositing conductive ink drops at selected locations of the conductive material not covered by the adhesive material.

Further provided is the method including: depositing on a second substrate at least a conductive material; positioning the second substrate in relation to the first substrate for at least some of the conductive material of the first substrate to be aligned and in operational contact with at least some of the conductive ink drops of the first substrate, wherein the at least some conductive material of the second substrate and the at least some conductive ink drops of the first substrate form a conductive path between the first substrate and the second substrate.

Further provided is the method including: depositing on the second substrate adhesive material, wherein at least a portion of the adhesive material on the second substrate and the adhesive material of the first substrate engage in a non-permanent attachment when the first substrate and the second substrate are brought into contact.

Further provided is the method wherein the detachable electrical connection is a detachable thin film pattern.

Further provided is the method wherein a porosity of the shadow mask structure is smaller than a pitch between portions of the conductive material.

Further provided is the method comprising; attaching a first substrate to the conductive material and the non-conductive adhesive material attaching a second substrate to the conductive material and the non-conductive adhesive material, wherein the attaching of the first substrate and the second substrate form an electrical connection between the first substrate and the second substrate; detaching the second substrate from the conductive material and the non-conductive adhesive material; attaching a third substrate to the conductive material and the non-conductive material, wherein the attaching of the first substrate and the third substrate form an electrical connection, between the first substrate and the second substrate.

BRIEF DESCRIPTION OF THE DRAWINGS

FIG. 1 depicts two flexible circuits bonded together by an anisotropic conductive adhesive film (ACF).

FIG. 2 illustrates a connection between two flexible electronic circuits (flex-to-flex connection), using a zero insertion force (ZIF) connector.

FIG. 3 depicts an arrangement of a detachable interconnection film or tape.

FIG. 4 illustrates an embodiment with the detachable interconnection film or tape employed for bonding two flexible circuits.

DETAILED DESCRIPTION

Figure 5A:
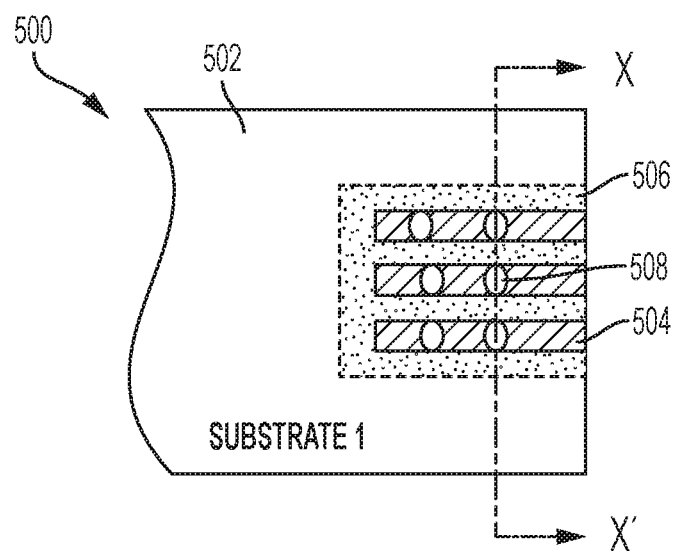
FIGS. 5A-5C show a detailed process for making detachable bonding between flexible electronic circuits (substrates).

Previously discussed in connection with FIGURES' 1 and 2 were existing manners of connecting flexible substrates carrying electronic/electrical elements.

Attention is now directed assemblies and methods for non-permanent attachment, detachment, re-attachment, and repositioning of connections between separate substrates. Where the substrates are understood to be part of electronic/electrical circuits or systems carrying electronic/electrical elements including conductive electrodes, contact pads, tabs, among various other elements. The electronic/electrical circuits or systems may comprise any other a number of circuits or system types including but not limited to chemical sensors, biological sensors, among others.

Turning to FIG. 3 illustrated is a basic structure for an embodiment of a detachable flexible interconnection film or tape 300 according to the present application. In this embodiment, the structure of film or tape 300 includes repeating distinct areas of conductive material 302 alternating with distinct sections of adhesive material 304.

The adhesive material 304 is formed from a composition which permits non-permanent attachment, detachment, reattachment, and repositioning of the adhesive material. Stated another way, the adhesive composition allows a non-permanent connection by a separate element (e.g., a substrate, with electronic/electrical circuits, and including contact pads, tabs, etc.) to the adhesive material, wherein a pulling force applied to a substrate does not destroy the substrate, but rather removes the substrate form connection will keeping the substrate in essentially the same state as when it was attached.

Thus FIG. 3 illustrates a plurality of conductive aggregates surrounded by non-conductive adhesive in the detachable flexible interconnection film or tape 300. The conductive aggregates can be printed with silver ink, such as DuPont 5029, gold or copper inks, as well as other appropriate materials. The non-conductive adhesive can be a removable pressure sensitive tacky substance, such as acrylate-based polymers such as 3M Scotch® Spray Mount™, as well as other appropriate materials. The conductive material 302 and adhesive material 304 are understood to be non-anisotropic type materials.

It is to be appreciated tape or film arrangement 300 is in certain embodiments configured as a two-sided or double-sided tape or film, wherein the conductive material 302 and adhesive material 304 are exposed on both sides of the tape or film 300.

In other embodiments, tape or film 300 may configured as a single-sided tape or film where on one side the conductive material 302 and non-permanent adhesive material 304 are accessible to a substrate, while the other side conductive material may be accessible in some form, but the connection arrangement provides a permanent connection to a substrate rather than a non-permanent.

Turning now to FIG. 4 illustrated is an assembly or arrangement 400 where detachable flexible interconnection film or tape 300 is provided to form a conductive and physical connection between separate substrates, such as first substrate 402 and second substrate 404. On one surface of first substrate 402 are conductive materials 406, in this embodiment provided as strips of separated conductive material, and which may be considered to be contact pads or tabs, etc. Second substrate 404 includes similar conductive material in the form of strips or contact pads or tabs 408. The space between the conductive materials 406, 408 on a surface of each of substrates 402, 404 may be a flexible plastic, such as polyimide, Polyether ether ketone (PEEK), Polyethylene terephthalate (PET), polyester film, or other material that is appropriate for use in formation of electronic flexible circuits.

Also shown in FIG. 4 on another surface of, for example, the second substrate 404 are elements 410 which in certain embodiments may be contact pads for attachment to other components not shown. Elements 410 also are intended to represent electrical components themselves positioned on the substrate surface, including but not limited to sensors including chemical sensors, biological sensors, and/or other electronic/electrical elements. It is understood at least some of the elements 410 would have a conductive path to the electrodes 408.

The circuitry represented by elements 410 in this exemplifies the concept that substrates 402 and 404 are, in at least certain embodiments, flexible electronic/electrical circuits or systems. It is to be understood from the foregoing that such electronic elements, such as elements 410 are in embodiments herein also found on a surface of the first substrate 402.

In fabrication, detachable flexible interconnection film or tape 300 of FIG. 3 is placed between substrates 402 and 404. The part of the detachable flexible interconnection film or tape 300 that is showing is one of the adhesive material portions 304. It is understood that if more of the second substrate 404 were pulled back, the other conductive material portions 302 would be shown, as each of the conductive elements or segments and adhesive material segments 304 are understood to be underneath part of the second substrate 404.

It is further noted that the flexing or bending of second substrate 404 is provided to show the flexibility of the substrate (i.e., flexible electronic/electrical circuit or system) to which the present concepts are directed.

As depicted in FIG. 4, substrates 402, 404 are aligned and positioned with respect to each other, and with the detachable flexible interconnection film or tape 300 placed therebetween. Applying a slight sufficient pressure (e.g., 1 to 100 psi) to the substrates results in a non-permanent adhesive contact between the adhesive material portions 304 and surfaces of substrates 402, 404. By this contact, the conductive material portions or segments 302 (not shown in FIG. 4 but understood to be underneath the second substrate 404) provide a conductive path which includes conductive elements 406, conductive material portions 302, and conductive elements 408, where these elements align, thus providing a conductive path between the first substrate 402 and the second substrate 404.

As the adhesive material 304 is made of a composition that allows detachment, the user may just peel off, for example, the second substrate thereby allowing the previous connection a non-permanent detachable attachment.

By this design once the (for example) second substrate 404 is removed, a third substrate such as substrate 412 can be placed into interconnection with the first substrate 402.

This arrangement therefore emphasizes that in certain embodiments, the second substrate, for example, may be disposable and a third substrate 412 is placed into non-permanent contact with the first substrate 402. This is useful in the instance where one of the flexible circuits is, for example inexpensive compared to the other flexible circuit. Then instead of replacing the entire system (e.g., the first substrate 402 and substrate 404), the less expensive flexible circuit can be removed, and then replaced with a similarly inexpensive replacement thereby maintaining the more expensive circuitry for further use. Alternatively, the removed substrate can be repaired, possible offsite, and then re-attached.

It is also understood that while the foregoing has discussed the substrates 402, 404, and 412 as being flexible substrates, the concepts described herein are also useful for non-flexible substrate circuits or systems, such as in situations where, for example, the first substrate 402 might be understood to be a rigid or non-flexible electrical/electronic circuit or system, while the second substrate 404 is a flexible substrate. Still, in other embodiments the connection concepts of the present application may be beneficial when both of the substrates are rigid.

By the above description, FIG. 4 illustrates an application of flex-to-flex bonding. There are conductive electrodes (e.g., contact pads, tabs on both substrates and they can be bonded together by placing the interconnection film or tape in between and applying a light pressure. This bonding can be detached by peeling and can be re-attached.

A particular aspect of the teaching herein is an understanding that in the flexible circuits of the present concepts. For example such lower temperatures would be less than 200 C for the fabrication processes in flexible circuits or systems to avoid damage and or destruction of the electronic circuits (e.g., substrates). Therefore, this low temperature requires connections that are not employed for connection between rigid substrates.

Figure 5B:
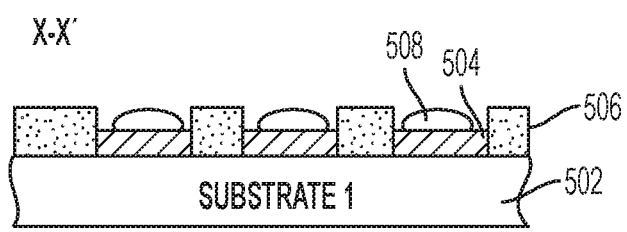
Figure 5C:
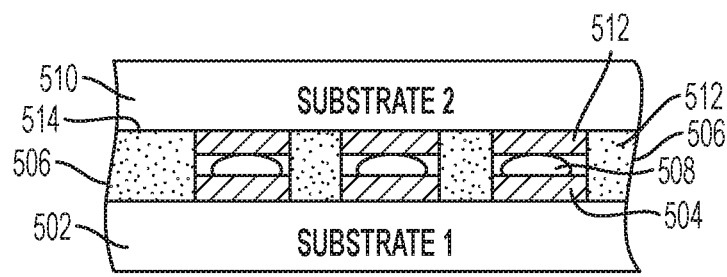

Turning to FIGS. 5A-5C illustrated is an alternative embodiment according to the teachings of the present application.

FIG. 5A depicts a top view of a process for forming a detachable assembly according to the present teachings, with FIG. 5B showing a side view of FIG. 5A along lines X-X'. More particularly, arrangement 500 of FIG. 5A includes a substrate 502 which as discussed in previous embodiments may be designed as a flexible electronic/electrical circuit (or in other embodiments a rigid electronic/electrical circuit). In this embodiment, conductive material 504, in the form of separated or spaced electrode strips, are deposited on substrate 502. Thereafter, non-conductive adhesive material 506 is deposited selectively on areas outside of the conductive material (i.e., conductive pads, tabs or electrodes) 506. Thereafter, conductive ink droplets 508 are deposited on selected portions of the conductive material 506. The depositing operations discussed above are accomplished in a normal fashion by known techniques and devices (e.g., conductive ink printers, deposition devices, etc.).

It is appreciated that it is not required to have the conductive material and non-conductive adhesive material deposited exactly as shown in the pattern of FIG. 5A and other alternatives would be appropriate. A particular aspect is to have at least some portion of the contact pads, tabs or electrodes 506 covered by the conductive ink droplets 508. The result of this fabrication is shown in the side view cross-lined X-X' of FIG. 5B. The conductive material and non-conductive adhesive material may be of material such as discussed above.

Along with substrate 502 of FIGS. 5A and 5B, a second substrate 510 with contact pads, tabs or electrodes 512 (which correspond to the electrodes 504 on substrate 502) is provided and brought into contact (by application of a slight sufficient pressure) with the first substrate 502 as shown in FIG. 5C. This arrangement provides a conductive path between substrate 502 and substrate 510 via electrodes 504, conductive ink drops 508, and electrodes 512.

Substrate 502 and substrate 510 are maintained in non-permanent attachment by at least some portions of the non-conductive areas 514 of substrate 510 coming into contact with non-conductive adhesive material 506 of substrate 510.

As in previous embodiments, the first substrate and second substrate 510 may be separated simply by applying a pulling force (e.g., peeling) to one of the substrates sufficient to overcome the non-permanent adhesive bond between non-conductive areas 514 and adhesive material 506.

As in previous embodiments, substrate 502 and substrate 510 may both be understood to be flexible electronic/electrical circuits or systems, or one may be a rigid substrate electronic/electrical circuit or system, or still both may be rigid substrates (e.g., electronic circuits).

Still further, in FIGS. 5A-5C, the non-conductive adhesive material 506 is shown in FIG. 5B to be of a sufficient height that when substrate is brought into engagement with substrate 502 the adhesive material 506 comes into contact with non-conductive area 514. However, in other embodiments, the adhesive material 506 is at a lower height and the substrate 520 is designed with its own adhesive material at a height such that the adhesive materials on each side meet and provide non-permanent attachment.

Still further under this embodiment, since the non-permanent adhesive attachment by non-conductive adhesive 506 is also attached to the first substrate, it would be understood that in certain embodiments, the first substrate could also be removed.

Thus FIGS. 5A-5C illustrate a first substrate with non-conductive adhesive material deposited selectively on an area outside of the electrodes or contact pads, and conductive ink deposited on the electrodes or contact pads. It is noted that it is not necessary to have conductive material and non-conductive adhesive materials of the substrates deposited exactly as the pattern shown in the figures. A minimum requirement is to have some portion of the electrodes contact pads covered by the conductive ink. Then as shown in FIG. 5C, the second substrate is overlaid on the top of the connection layer with at least some of the contact pads aligned with the first substrate. With a light pressure application, conduction paths are formed between the two substrates. The two substrates can be separated by peeling and a re-attachment operation can be undertaken with the same or different substrates.

The concepts depicted in FIGS. 5A-5C has been investigated in an experiment. For the adhesive material deposition, the electrode area was covered by a shadow mask. 3M repositionable adhesive (Spray Mount) was sprayed onto the substrate with the shadow mask.

Figure 6:
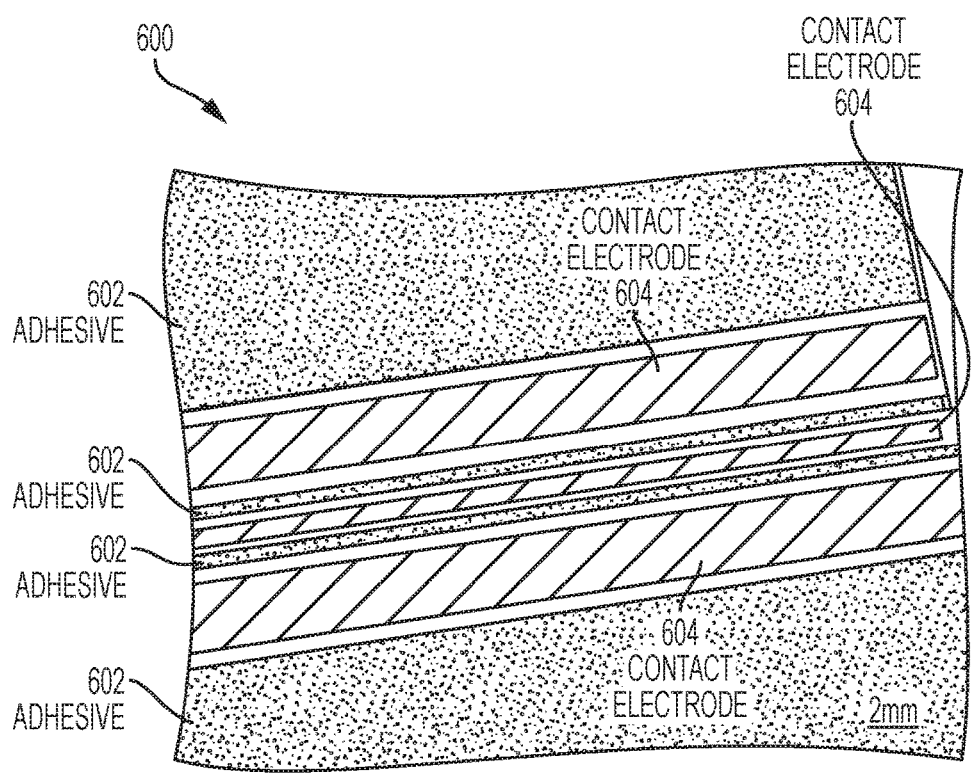
FIG. 6 is a microscope photo showing adhesive material deposited outside of an electrode area.

FIG. 6 is a microscope photo showing a Polyethylene terephthalate (PET) substrate patterned according to the concepts of the present application, and with silver electrode areas 602. The nonconductive adhesive 604 is deposited outside of the electrode areas 602. Then, silver printed drops (less than 1 mm in diameter) are formed (not shown, but similar to those shown in FIGS. 5A-5C).

In testing a second substrate with the same electrode dimension is bonded with the first substrate shown in FIG. 6. An ohm meter measurement showed good conductance. The two pieces were then separated and re-attached. The electrical connection remained good after the reattachment.

Figure 7:
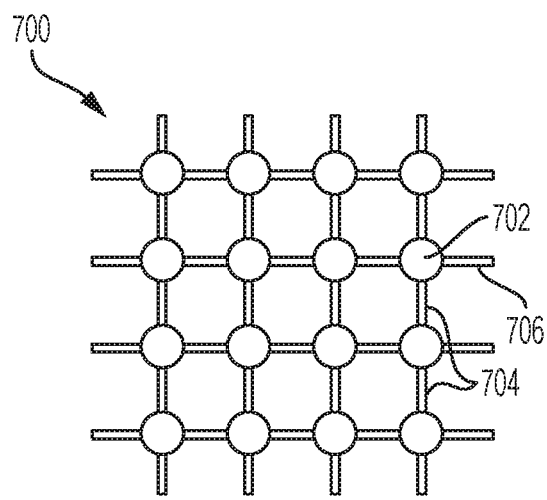
FIG. 7 illustrates a shadow mask for use with a spray adhesive for producing a flexible connection according to the present teachings.

An alternative approach for the detachable connection is to develop general fine patterns of non-conductive adhesive and conductive ink. FIG. 7 shows an example of a dot-array shadow mask 700. The diameter of dots 702 can be 50-200 um, and they are supported by a grid formed by lines of rows and columns 704, 706. The shadow mask 700 of FIG. 7, is used for adhesive deposition over a substrate with an electrode pattern. The shadow mask of this embodiment does not need to be aligned exactly against the electrode pattern (e.g., of FIG. 8), since the feature dimension of the shadow mask 700 is much smaller than the feature size of the electrode on the substrate (i.e., a porosity of the structure for the conductive ink drops (see, FIG. 8) is smaller than a pitch between portions of the conductive material).

Figure 8:
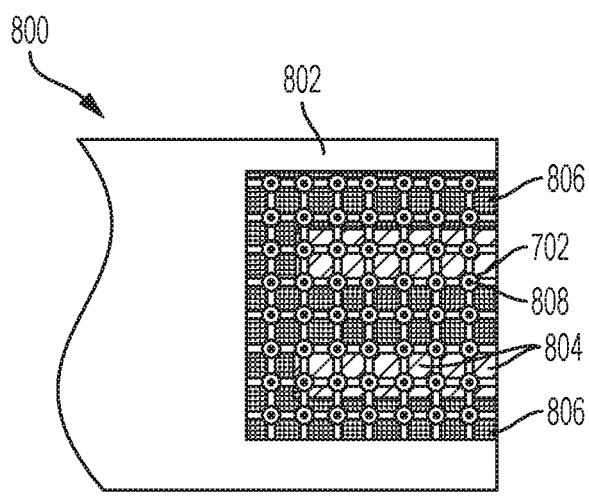
FIG. 8 illustrates an embodiment to arrange fine patterns of non-conductive adhesive and conductive ink for detachable electrical flex-to-flex connection, with a conductive dot array employed in the context of the present application.

In other words, as shown in arrangement 800 of FIG. 8, substrate 802, electrodes 804 have been deposited. Next a shadow mask (e.g., 700 of FIG. 7 dots 702) was overlaid the electrodes and other portions of the substrate. Thereafter, the non-conductive adhesive 806 is deposited (i.e., not over the electrode areas 804). The shadow mask (e.g., of FIG. 7) is removed after the pattern of non-conductive adhesive 806 is formed. Then conductive ink drops 808 were jetted onto dots 702. The dots 702 and grid pattern 704, 706 (FIG. 7) are sufficiently small as compared to the widths and spacing of the electrodes 804 such that conductive ink drops 808 placed on dots 702 are ensured to be over at least some portion of electrodes 804. This arrangement can be pre-made on a circuit connection pads, which forms a readily detachable connection to the other circuit.

The embodiments herein and above describe the construction of a thin film or form structure of selective deposition of fine patterns of non-conductive adhesive and conductive ink for detachable electrical flex-to-flex connection, as well as a method of making a detachable thin film pattern.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A detachable electrical connection assembly comprising:
   a conductive material;
   an adhesive material consisting of an adhesive composition configured to permit non-permanent attachment, detachment and re-attachment of the adhesive material, wherein at least a portion of the conductive material is positioned between the adhesive material having the adhesive composition which permits non-permanent attachment, detachment, and re-attachment of the adhesive material;

the conductive material and the adhesive material being located on a first surface of a first substrate;

conductive ink drops selectively located on portions of the conductive material of the first substrate; and a second substrate having at least some conductive material on a first surface corresponding to at least some of the conductive ink dots, wherein the second substrate is positioned wherein at least some of the conductive material on the second substrate are in contact with at least some of the conductive ink dots.

2. The detachable electrical connection assembly of claim 1, wherein the second substrate further includes adhesive material consisting of the adhesive composition configured to permit non-permanent attachment, de-attachment, and re-attachment to the adhesive material.

3. The detachable electrical connection assembly of claim 1, wherein the adhesive material on the first substrate has a sufficient height to encounter the surface of the second substrate, wherein the second substrate is detachable from the adhesive material of the first substrate.

4. The detachable electrical connection assembly of claim 1, wherein the second substrate is detached from the adhesive material of the first substrate and a third substrate is attached in a non-permanent attachment to the adhesive material, wherein the first substrate and the third substrate form an electrical connection.

5. The detachable electrical connection assembly of claim 1, wherein a porosity of a structure for the conductive ink drops is smaller than a pitch between portions of the conductive material.

6. The detachable electrical connection assembly of claim 1, wherein at least one of the first substrate and the second substrate are a flexible electronic circuit board.

7. The detachable electrical connection assembly of claim 1, wherein one of the first substrate and second substrate are designed as at least one of a disposable chemical sensor and a disposable biological sensor.

8. A method of forming a detachable electrical connection for a flexible circuit comprising:

depositing a conductive material onto areas of a first substrate;

depositing an adhesive material onto other areas of the first substrate, consisting of an adhesive composition configured to permit non-permanent attachment, detachment, and re-attachment of the adhesive material;

wherein the depositing steps result in at least a portion of the conductive material being positioned between portions of the adhesive material which permits non-permanent attachment, detachment, and re-attachment to the adhesive material;

following the depositing of the conductive material onto the areas of the first substrate, providing a shadow mask over the deposited conductive material prior to the depositing of the adhesive material;

the depositing of the adhesive material being accomplished by spraying the adhesive material onto the area of the first substrate, wherein the sprayed adhesive material covers the area of the first substrate except for locations defined by the shadow mask which include selected areas of the conductive material;

removing the shadow mask to expose portions of the conductive material not covered by the adhesive material; and depositing conductive ink drops at selected locations of the conductive material not covered by the adhesive material.

9. The method according to claim 8, further including:

depositing on a second substrate at least a conductive material;

positioning the second substrate in relation to the first substrate for at least some of the conductive material of the first substrate to be aligned and in operational contact with at least some of the conductive ink drops of the first substrate, wherein the at least some conductive material of the second substrate and the at least some conductive ink drops of the first substrate form a conductive path between the first substrate and the second substrate.

10. The method according to claim 9, further including:

depositing on the second substrate additional adhesive material, wherein at least a portion of the additional adhesive material on the second substrate and the adhesive material of the first substrate engage in a non-permanent attachment when the first substrate and the second substrate are brought into contact.

11. The method according to claim 8, wherein the detachable electrical connection is a detachable thin film pattern.

12. The method according to claim 8, wherein a porosity of the shadow mask structure is smaller than a pitch between portions of the conductive material.

13. A method of forming a detachable electrical connection for a flexible circuit comprising:

depositing a conductive material onto areas of a first substrate;

depositing an adhesive material onto other areas of the first substrate, consisting of an adhesive composition configured to permit non-permanent attachment, detachment, and re-attachment of the adhesive material, wherein the depositing steps result in at least a portion of the conductive material being positioned between portions of the adhesive material which permits non-permanent attachment, detachment, and re-attachment of the adhesive material;

attaching the first substrate to the conductive material and the non-conductive adhesive material attaching the second substrate to the conductive material and the non-conductive adhesive material, wherein the attaching of the first substrate and the second substrate form an electrical connection between the first substrate and the second substrate;

detaching the second substrate from the conductive material and the non-conductive adhesive material;

attaching a third substrate to the conductive material and the non-conductive material, wherein the attaching of the first substrate and the third substrate form an electrical connection, between the first substrate and the third substrate.

\* \* \* \* \*